(12) United States Patent
Roberts et al.

(10) Patent No.: US 8,450,926 B2
(45) Date of Patent: May 28, 2013

(54) OLED LIGHTING DEVICES INCLUDING ELECTRODES WITH MAGNETIC MATERIAL

(75) Inventors: Bruce R. Roberts, Mentor-on-the-Lake, OH (US); Kevin C. Payne, Brecksville, OH (US); Donald Seton Farquhar, Niskayuna, NY (US); Stefan Rakuff, Clifton Park, NY (US); Michael Scott Herzog, Voorheesville, NY (US)

(73) Assignee: General Electric Company, Schenectady, NY (US)

( * ) Notice: Subject to any disclaimer, the term of this patent is extended or adjusted under 35 U.S.C. 154(b) by 21 days.

(21) Appl. No.: 12/470,067

(22) Filed: May 21, 2009

(65) Prior Publication Data

US 2010/0295443 A1    Nov. 25, 2010

(51) Int. Cl.
*H01L 51/50*    (2006.01)
(52) U.S. Cl.
USPC .......................................... 313/512; 313/504
(58) Field of Classification Search
None
See application file for complete search history.

(56) References Cited

U.S. PATENT DOCUMENTS

| | | | |
|---|---|---|---|
| 5,397,238 | A  | 3/1995  | Och |
| 6,413,645 | B1 | 7/2002  | Graff et al. |
| 6,492,026 | B1 | 12/2002 | Graff et al. |
| 6,537,688 | B2 | 3/2003  | Silvernail et al. |
| 6,624,568 | B2 | 9/2003  | Silvernail |
| 6,661,029 | B1 | 12/2003 | Duggal |
| 6,700,322 | B1 | 3/2004  | Duggal et al. |
| 6,777,871 | B2 | 8/2004  | Duggal et al. |
| 6,800,999 | B1 | 10/2004 | Duggal et al. |
| 7,015,640 | B2 | 3/2006  | Schaepkens et al. |
| 2004/0121508 | A1 | 6/2004 | Foust et al. |
| 2008/0231180 | A1* | 9/2008 | Waffenschmidt et al. .... 313/506 |
| 2008/0278932 | A1 | 11/2008 | Tress |

FOREIGN PATENT DOCUMENTS

| | | |
|---|---|---|
| DE | 202007017609 U1 | 4/2008 |
| DE | 202008015553 U1 | 2/2009 |
| GB | 2233837 | 1/1991 |
| WO | WO 2008/012702 | 1/2008 |
| WO | 2008023008 A1 | 2/2008 |
| WO | WO 2008/099305 | 8/2008 |
| WO | WO 2008099306 A1 * | 8/2008 |
| WO | 2009043561 A2 | 4/2009 |

OTHER PUBLICATIONS

Philips Instruction Manual, "Lumiblade," Philips Lighting, pp. 1-12.
PCT/US2010/030072, Search Report and Written Opinion, Jun. 30, 2010.

* cited by examiner

*Primary Examiner* — Britt D Hanley
(74) *Attorney, Agent, or Firm* — Fay Sharpe LLP

(57) ABSTRACT

An article of manufacture comprises a thin film solid state lighting device, such as an organic light emitting diode (OLED) device, having a planar light emitting side and an opposite planar mounting side and including electrodes disposed on the planar mounting side of the thin film solid state lighting device, the electrodes including a magnetic material configured to conductively convey electrical drive current to drive the thin film solid state lighting device to emit light at the planar light emitting principal side. The article of manufacture may further comprise a fixture having a planar surface with magnets arranged to mate with the electrodes to magnetically secure the thin film solid state lighting device with the fixture and to concurrently form electrically conductive paths including the magnetic material of the electrodes configured to conductively convey electrical drive current. Thus this magnetic connection provides both mechanical support and electrical conduction path.

20 Claims, 11 Drawing Sheets

OLED LIGHTING DEVICES INCLUDING ELECTRODES WITH MAGNETIC MATERIAL

BACKGROUND

The following relates to the illumination arts, lighting arts, solid state lighting arts, organic light emitting diode (OLED) device arts, and related arts.

Thin film solid state lighting technologies such as thin film electroluminescent (TFEL) devices, organic light emitting diode (OLED) device arts, and so forth have become prevalent display and lighting technologies. These devices can be made thin (e.g., a few millimeters or less in thickness). Additionally, TFEL and OLED devices produce illumination over large area, with the illumination output area sometimes being close to coextensive with the area of the active OLED device film structure. These geometric aspects make thin film solid state lighting devices useful as light sources in "illuminated walls" or other architectural accent or illumination lighting, in undercabinet lighting, and in other types of lighting where space is at a premium and a thin and large-area planar light source is advantageous. Still further, some thin film solid state lighting technologies can be fabricated in flexible form so as to enable flexible lighting sources suitable for use in flexible cards or for mounting on curved support surfaces such as curved pillar walls or the like.

One deficiency in the state of the art lies in the mounting and electrical interconnect technologies for such devices. Although thin film solid state lighting devices can be made thin, large-area, and optionally flexible, these advantages are currently lost to a substantial degree due to size, bulkiness, and rigidity of existing mounting and electrical power input structures. Indeed, in most existing thin film solid state lighting devices the mounting and electrical power input structures are several times thicker than the active light-producing structure, which is typically in the form of a thin film disposed on thin glass or plastic substrates.

For example, one technique currently in use for packaging OLED devices is to employ edge connectors for the electrical input. In such a configuration, the active OLED layers are sandwiched between glass plates or plastic films, and electrodes connecting with edges of the OLED layers extend outside the edges of the sandwiching glass or plastic confinement to form edge connectors. This approach requires an electrically conductive mating structure connecting with the electrodes at the edges of the device. A disadvantage is that the lateral area occupied by the edge electrodes and corresponding mating structures reduces the light emission area of the packaged lighting device, thus reducing the value of the large illumination area of the unpackaged device. For OLED devices which are susceptible to damage from ambient moisture or oxygen, the edge connectors also compromise the hermetic seal at the edges of the confining glass or plastic plates or films.

Other packaging techniques are disclosed in WO 2008/012702 A1 and WO 2008/099305 A1. The approach of WO 2008/012702 A1 employs wireless inductive power transmission in which the OLED device has an "on-board" power receive inductor and on-board power conditioning electronics. Although the on-board inductive coil is described as "planar", the addition of these on-board component inherently introduces additional complexity, bulk, and thickness to the OLED device.

WO 2008/099305 A1 likewise discloses on-board power conversion and control circuitry which increases bulk and thickness. The electrical connections in WO 2008/099305 A1 are disposed on a backside of the lighting module which connect with bus lines when the lighting module is secured to a printed circuit board mounting structure by on-board clamps, on-board screws, or on-board magnets. The on-board mounting clamps, screws, or magnets contribute still further to the complexity, bulk, and thickness of the OLED lighting devices.

BRIEF SUMMARY

In some illustrative embodiments disclosed herein, an article of manufacture is disclosed, comprising a thin film solid state lighting device having a planar light emitting side and an opposite planar mounting side and including electrodes disposed on the planar mounting side of the thin film solid state lighting device, the electrodes including a magnetic material configured to conductively convey electrical drive current to drive the thin film solid state lighting device to emit light at the planar light emitting principal side. This method of electrical and mechanical connections thus preserves the thin form factor and hermetic seal of the package.

In some illustrative embodiments disclosed herein, an article of manufacture is disclosed, comprising a thin film solid state lighting device having a planar light emitting side and an opposite planar mounting side including a magnetic material disposed on the planar mounting side, wherein the magnetic material is not magnetized to define a permanent magnet and is not a component of an inductive element. This method of electrical and mechanical connections thus preserves the thin form factor and hermetic seal of the package.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention.

DETAILED DESCRIPTION OF PREFERRED EMBODIMENTS

Figure 1:
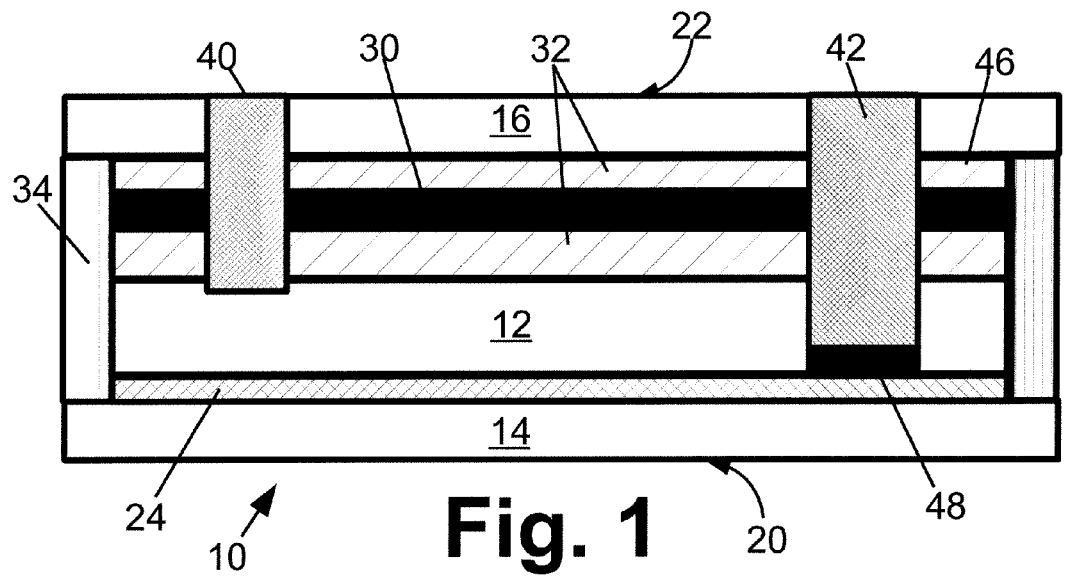
FIGS. 1 and 2 diagrammatically illustrate cross-sectional views of two embodiments of a disclosed thin film solid state lighting device.

With reference to FIG. 1, a thin film solid state lighting device 10 includes a thin film light emitting structure 12. In the illustrated embodiments, the thin film light emitting structure 12 is a light emitting polymer or multilayer structure including one or more layers of light emitting polymer, and the thin film solid state lighting device 10 is of a type known as an organic light emitting diode (OLED) device. Other types of thin film light emitting structures are also contemplated, such as a thin film electroluminescent (TFEL) light emitting structure. The thin film light emitting structure 12 may have an electrical polarity, as is typically the case for OLED devices, in which case there are distinguishable positive and negative electrical terminals. Alternatively, the thin film light emitting structure 12 may be non-polar and have no particular electrical polarity. Although diagrammatically illustrated for simplicity as a single layer, the thin film light emitting structure 12 may include multiple layers of different materials, or may be divided laterally into electrically distinct portions interconnected electrically in series or otherwise electrically configured, or so forth.

The illustrated OLED device 10 includes the thin film light emitting structure 12 disposed between confining layers or structures 14, 16, such as confining glass plates or sheets, confining layers of plastic, or so forth. The front confinement layer 14 is transparent or translucent so that a front surface 20 is a planar light emitting side 20. The back confinement layer 16 defines an opposite planar mounting side 22. In some embodiments the confinement layers 14, 16 and the planar OLED device 10 as a whole is flexible, while in other embodiments the confinement layers 14, 16 and the planar OLED device 10 as a whole is substantially rigid. The term "planar" as used herein is to be understood as encompassing such flexibility.

The thin film light emitting structure 12 includes electrical inputs in the form of metallic or other electrically conductive layers configured to transfer drive electrical current into the light emitting polymer or other optically active material in order to cause the optically active material to emit light. In FIG. 1, one such electric input is illustratively shown, namely an indium tin oxide (ITO) layer 24 disposed on or proximate to the front confinement layer 14. Advantageously, ITO is optically transparent or translucent over at least most of the visible light spectrum, and its use therefore promotes light emission at the planar light emitting side 20. Typically, at least two metallic or other electrically conductive layers configured to transfer drive electrical current into the light emitting polymer or other optically active material are provided, in order to permit drive current to flow through the optically active material. Although not illustrated, the metallic or other electrically conductive layers may be lithographically patterned or otherwise laterally confined or patterned to define a selected electrical configuration. For example, in OLED devices these layers are sometimes patterned to electrically define a plurality of series-interconnected regions of light emitting polymer material.

In the illustrative case of an OLED device, the light emitting polymer is typically sensitive to moisture and oxygen and degrades upon excessive environmental exposure. Accordingly, the thin film solid state lighting device 10 is designed as a hermetically sealed planar unit. Some glass and transparent or translucent plastic materials typically used for the confinement layers 14, 16 are permeable to moisture to an undesirably high degree. To reduce this source of moisture ingress, an aluminum layer or other water-impermeable layer 30 is optionally disposed between the thin film light emitting structure 12 and the confinement layer 16. To avoid electrical shorting or shunting via the electrically conductive aluminum, suitable insulating cladding material 32 surrounds the aluminum layer 30. To suppress moisture ingress from the sides, water-impermeable peripheral adhesive 34 or another suitable sealant is disposed around the periphery of the confinement layers 14, 16 to complete the hermetical sealing of the thin film light emitting structure 12. Although the sealing structures 30, 34 are described herein as sealants against moisture ingress, these and optionally additional or other sealant structures can be provided to seal against ingress of various potentially detrimental contaminants such as oxygen.

In order to apply electrical drive current to the thin film light emitting structure 12 in order to cause it to emit light, electrodes 40, 42 are provided. The illustrated electrodes 40, 42 pass through vias formed in the back confinement layer 16 and in the optional water-impermeable layer 30. In the latter case, a suitable via insulation arrangement (not shown) electrically isolates the electrodes 40, 42 from the illustrative aluminum 30. Further features not shown in diagrammatic FIG. 1 may be added to promote hermetic sealing around the electrodes 40, 42. (See FIGS. 11-14 for some illustrative examples of suitable hermetic sealing arrangements). The electrodes extend outside of the hermetically sealed planar unit, or in other words the electrodes 40, 42 are exposed at the planar mounting side 22 to provide external electrical access to the thin film light emitting structure 12.

Furthermore, the electrodes 40, 42 include a magnetic material. In some preferred embodiments, the magnetic material is nickel or a nickel alloy. Other suitable magnetic materials include iron or iron alloys, cobalt or cobalt alloys, or other ferromagnetic elements or alloys thereof. The magnetic material is also electrically conductive to conductively convey electrical drive current to drive the thin film solid state lighting device 10 to emit light at the planar light emitting principal side 20.

Aluminum, which is a conventional material for use as the electrodes of OLED devices, is not a magnetic material. Accordingly, since the electrodes 40, 42 include a magnetic material, they cannot be made entirely of aluminum. However, it is contemplated to include other materials in the electrodes, including nonmagnetic materials. For example, In FIG. 1 the electrode 42 includes a portion 48 that is made of aluminum. The aluminum portion 48 provides improved electrical transport between the bulk of the electrode 42 which is made of nickel, a nickel alloy, or another magnetic material, and the ITO layer 24.

Manufacturing of the thin film light emitting device 10 employs a suitable combination of material deposition steps, photolithography steps or other pattern definition steps, and other conventional material fabrication operations. For example, in one approach the confinement layer 14 is a glass or plastic substrate with some rigidity that serves as a starting substrate. The ITO layer 24 is formed on the substrate 14 by vacuum evaporation or another suitable technique and, optionally, patterned to define a pattern of serial interconnects or other electrical features. The light emitting polymer layer or layers and optionally other material layers comprising the thin film light emitting structure 12 are next deposited using deposition techniques suited for the particular materials, followed by processing to form the hermetic electrodes 40, 42 and to ensure hermetic sealing. See examples set forth in FIGS. 11-14 for some illustrative fabrication examples.

In illustrative FIG. 1, the electrodes 40, 42 are shown with their exposed surfaces arranged flush with the exposed surface of the confinement layer 16 at the planar mounting side 22. However, it is also contemplated for the electrodes 40, 42 to extend outside and over a proximate portion of the exposed surface of the confinement layer 16. Such extension may be the case, for example, if the electrodes 40, 42 are formed by electroplating which mushrooms outside of the via inside which the magnetic material is electroplated.

The thin film solid state lighting device 10 shown in FIG. 1 is an illustrative example. Other configurations can be employed in which the electrodes are disposed on the planar mounting side 22 opposite the planar light emitting side 20, and in which the electrodes include a magnetic material.

Figure 2:
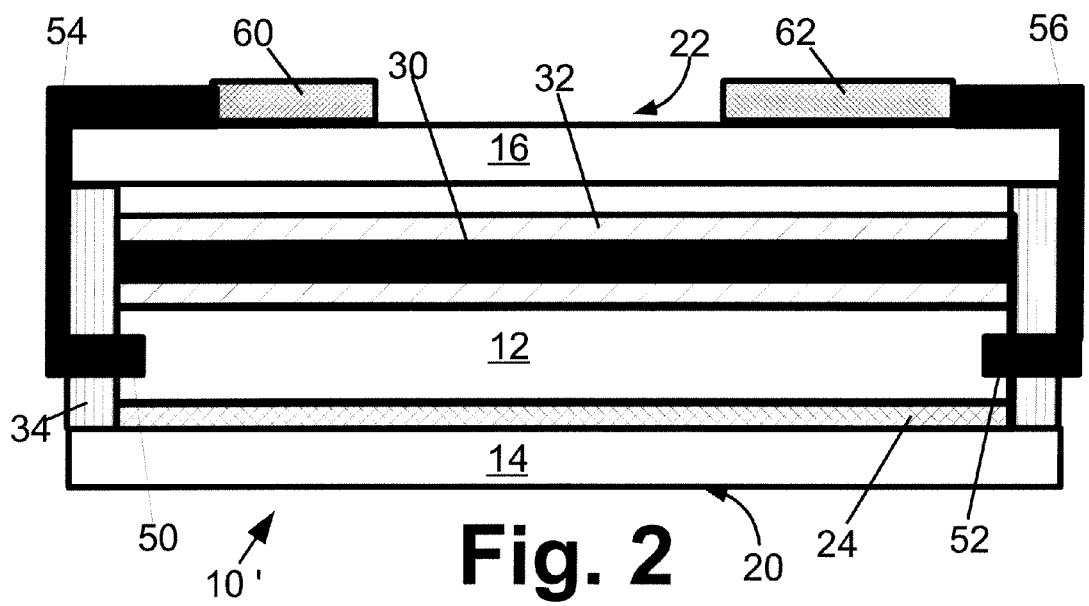

With reference to FIG. 2, for example, a modified thin film solid state lighting device 10' is similar to that of FIG. 1, except that the electrodes 40, 42 of FIG. 1 are replaced by side extending electrodes 50, 52 that pass through gaps in the peripheral sealing adhesive 34. The electrodes 50, 52 are wrapped around to the planar mounting side 22 by respective conductive trace portions 54, 56 made of aluminum or another conductive material to electrically contact electrode portions 60, 62 which are made of a magnetic material and are disposed on the planar mounting side 22 opposite the planar light emitting side 20. In other words, the electrode 50, 54, 60 defines a first electrical input to the thin film light emitting structure 12, while the electrode 52, 56, 62 defines a second electrical input to the thin film light emitting structure 12. Although in FIG. 2 only the electrode portions 60, 62 are made of a magnetic material such as nickel or a nickel alloy, optionally some or all of the other electrode portions 50, 52, 54, 56 may also be made of a magnetic material.

Figure 3:
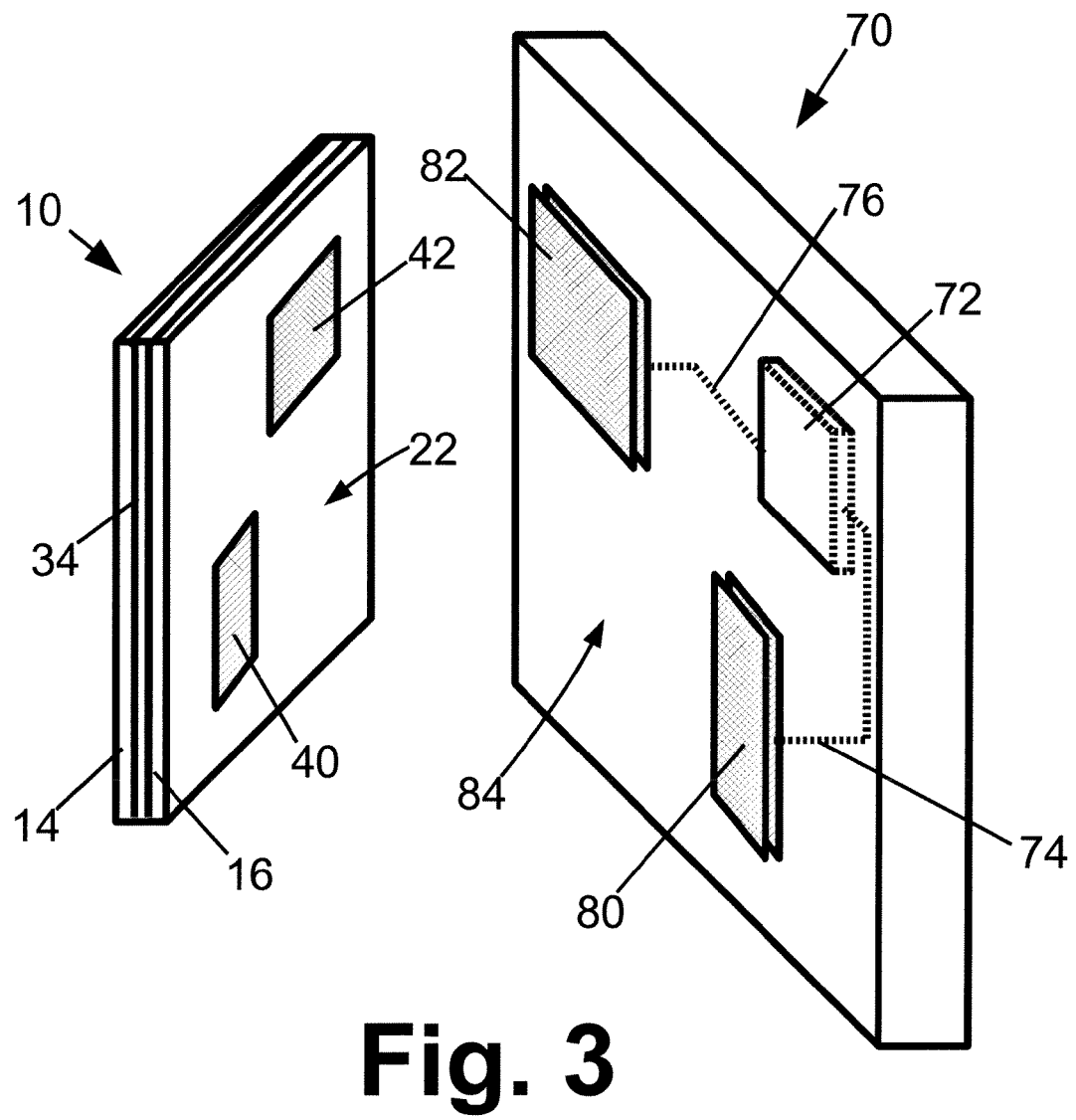
FIG. 3 diagrammatically illustrates the thin film solid state lighting device of FIG. 1 in position for magnetic attachment along with concurrent electrical connection to a fixture.

With returning reference to FIG. 1 and with further reference to FIG. 3, advantages of the disclosed thin film solid state lighting device 10 (or equivalently, of the disclosed thin film solid state lighting device 10') include the features that the electrodes 40, 42 enable convenient simultaneous magnetic and electrical connection of the thin film solid state lighting device 10 to a connection element such as an illustrated connecting element or fixture 70, or to a jumper element configured to electrically interconnect in series two of the thin film solid state lighting devices 10 shown in FIG. 1, or so forth. The fixture 70 includes an electrical power supply component 72 (shown in phantom in FIG. 3) which is disposed in or on a backside of the fixture 70.

The electrical power supply component 72 supplies electrical drive power or current suitable for energizing the thin film solid state lighting device 10 via electrical traces or conductors 74, 76 (again shown in phantom in FIG. 3). The electrical drive power or current is available at mating electrodes 80, 82 of the connection element 70. The mating electrodes 80, 82 are arranged on a planar surface 84 of the connection element 70 such that the mating electrodes 80, 82 align with and contact respective electrodes 40, 42 disposed on the planar mounting side 22 of the thin film solid state lighting device 10 when the two planar mounting side 22 is placed onto the planar surface 84 of the connection element 70. Note that FIG. 3 illustrates a point at which the thin film solid state lighting device 10 is being moved with the planar mounting side 22 facing toward the planar surface 84 of the fixture 70, but before contact is actually made. This view reveals the general alignment of the electrodes 40, 42 of the thin film light emitting device 10 with the corresponding mating electrodes 80, 82 of the connection element 70.

In the illustrated embodiment, the mating electrodes 80, 82 are magnetized to define permanent magnets. As a result, as the planar mounting side 22 facing toward the planar surface 84 of the fixture 70 is moved toward the fixture 70, the magnetic mating electrodes 80, 82 magnetically attract the magnetic material of the proximate corresponding electrodes 40, 42. This effectuates a "drawing in" of the thin film solid state lighting device 10 toward the planar surface 84 of the fixture 70, and additionally the electrodes 40, 42 are automatically aligned by the magnetic attraction with the magnetic mating electrodes 80, 82. The effect is that the thin film solid state lighting device 10 automatically snaps into place when moved close enough to the planar surface 84 of the fixture 70 with the electrodes 40, 42 correctly positioned and in conductive electrical contact with the correct corresponding mating electrodes 80, 82. In this way, the thin film solid state lighting device 10 mechanically mates with the fixture 70 and electrically connects with the fixture 70 to concurrently form an electrically conductive drive current path from the fixture 70 to the thin film solid state lighting device 10 that includes the electrodes 40, 42 disposed on the planar mounting side 22 of the thin film solid state lighting device 10.

In the case of the illustrated OLED device 10, which is a polar device, there is only one correct direction of current flow, since the OLED device will not operate if the current flow is in the wrong or "reverse" direction. Accordingly, the electrodes 40, 42 and corresponding mating electrodes 80, 82 are keyed by size and/or shape, as illustrated for example in FIG. 3, in order to ensure that the OLED device 10 is magnetically attached to the fixture 70 with the correct electrical polarity. Instead of keying the electrodes themselves, other keying features can be included on the planar mounting side 22 of the thin film solid state lighting device 10 and correspondingly on the planar surface 84 of the connection element 70 such that the connection can only be made (or can only easily be made) in the correct orientation.

In embodiments in which the electrodes 40, 42 are not magnetized to define permanent magnets, there are no permanent magnets on the thin film solid state lighting device 10. As a result, the thin film solid state lighting device 10 is not a hazard to neighboring digital storage media such as magnetic disks or FLASH memory units. The fixture 70 does include magnets, namely the electrodes 80, 82 which are magnetized to define permanent magnets. However, if the fixture 70 is a mounting element affixed to a wall or other fixed structure, then the likelihood of problems from stray magnetic fields is reduced.

It is also contemplated to have the mating electrodes 80, 82 of the fixture 70 be made of a magnetic material but not magnetized, and to have the electrodes 40, 42 of the thin film solid state lighting device 10 be magnetized to form permanent magnets. The observed operation is the same as already described, except that it will be appreciated that when not attached to the fixture 70 the thin film solid state lighting device will have permanent magnets and consequent stray magnetic fields.

In yet other contemplated embodiments, both the electrodes 40, 42 and the mating electrodes 80, 82 are magnetized to form permanent magnets. In these embodiments, the polarity of the permanent magnets must be such that magnetic attraction is generated, rather than magnetic repulsion. That is, the magnet of the electrode 40 facing the mating electrode 80 should have opposite magnetic polarity to that of the mating electrode 80, i.e. either "north/south" or "south/north". The analogous situation holds for the electrode/mating electrode pair 42, 82. In some such embodiments, the electrodes 40, 42 may have the same polarity (either both being north poles or both being south poles). In other such embodiments, the electrodes 40, 42 may have the opposite polarity—in these latter embodiments, the magnetic polarities of the electrodes 40, 42 can also be used to magnetically key the electrodes to the correct corresponding mating electrodes 80, 82, since in these latter embodiments attempting to connect (for example) electrode 40 to the wrong mating electrode 82 would result in a repulsive "north/north" or "south/south" combination.

The magnetic material of the electrodes 40, 42 (or of the electrodes 60, 62) is not a component of an inductive element, such as might be used in a wireless inductive power delivery system. As a result, the electrodes 40, 42 do not have associated inductor windings, are simple to fabricate, and can be made highly planar or even (as shown in FIG. 1) made flush with the planar mounting side 22. Moreover, since power transfer is conductive rather than wireless inductive, there is no need for a.c./d.c. power conversion circuitry on the thin film solid state lighting device 10. Indeed, in some embodiments including the illustrated embodiments the thin film solid state lighting device 10 is planar and does not include any power conditioning electronics. Instead, in the illustrated embodiments the power conditioning electronics 72 are disposed entirely on the fixture 70, which enables the planar thin film solid state lighting device 10 to be made exceedingly thin. Although the illustrated thin film solid state lighting device 10 does not include any power conditioning electronics, it is contemplated to include power conditioning electronics on other (not illustrated) embodiments of the thin film solid state lighting device.

The illustrated fixture 70 includes the electrical power supply component 72 which generates the drive electrical power or current. However, in other embodiments the drive electrical power or current may be delivered from elsewhere to the fixture. For example, in some embodiments the fixture may include one or more jumper elements configured to electrically interconnect in series two of the thin film solid state lighting devices 10. In this case, the connecting jumper element does not generate the drive electrical current, but rather receives the electrical drive current from one thin film solid state lighting device 10 and conducts it to the next thin film solid state lighting device 10.

As used herein, "magnetized to define a permanent magnet" or similar phraseology denotes magnetization to generate a permanent magnet having magnetic strength sufficient to mechanically secure the thin film solid state lighting device 10 with the fixture 70 and to effectuate conductive electrical connection between the electrodes 40, 42 and the corresponding mating electrodes 80, 82. The phrase "magnetized to define a permanent magnet" does not encompass residual magnetization such as may remain in magnetic material that is a component of an inductive element when the inductive element is de-energized or other stray fields left in ferromagnetic materials when exposed to permanent magnetic fields.

The mating electrodes 80, 82 may remain electrically energized when the thin film solid state lighting device 10 is disconnected. In this case, the voltage present at the energized mating electrodes 80, 82 should be at a non-hazardous level, such as at a level comporting with an Underwriters Laboratory (UL) class II power supply standard used in the United States.

With reference to FIGS. 4-9, some illustrative embodiments are shown which illustrate the flexibility of the disclosed arrangements for mounting thin film solid state lighting devices for general illumination purposes.

Figure 4:
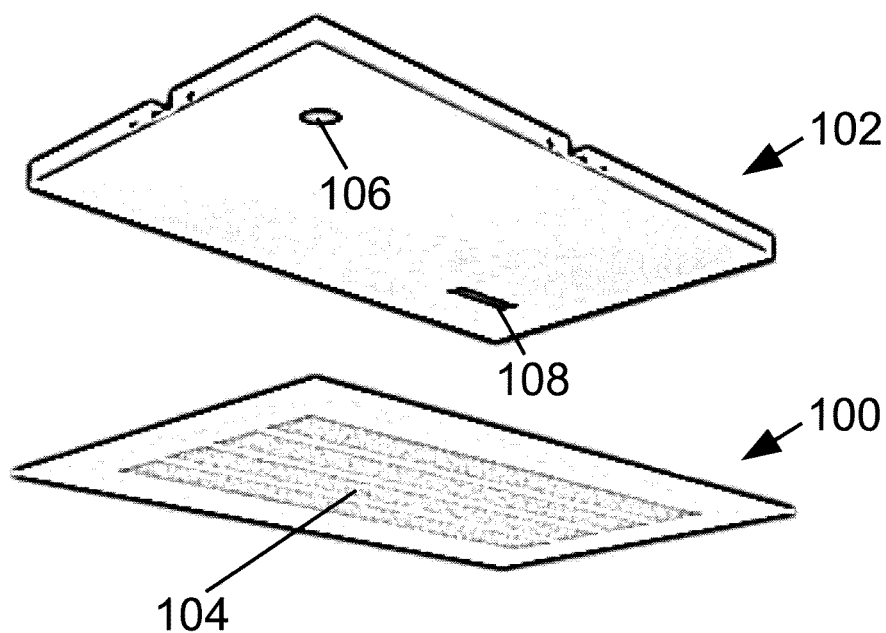
FIGS. 4-9 illustrate some examples of lighting fixtures employing the disclosed the thin film solid state lighting device mounting techniques.
Figure 5:
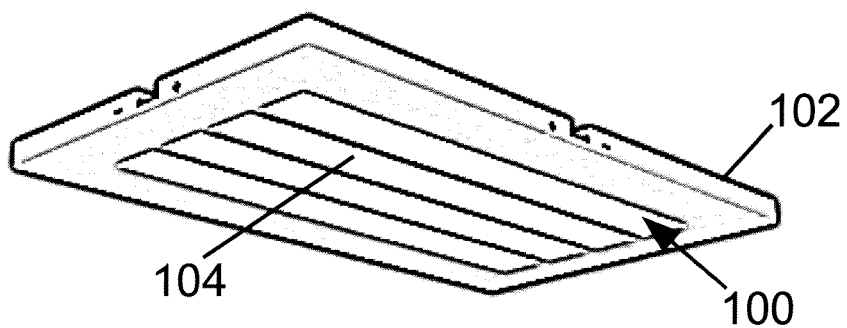

FIGS. 4 and 5 illustrate a mounting configuration for mounting a generally planar OLED device 100 in or on an overhead fixture 102. The OLED device includes a light emissive lower surface 104 facing generally downward, and an upper surface (not visible in FIGS. 4 and 5) which includes electrodes containing magnetic material corresponding to the electrodes 40, 42 (FIGS. 1 and 3) or to the electrodes 60, 62 (FIG. 2). The overhead fixture 102 corresponds to the fixture 70 shown in FIG. 3, and includes magnetic mating electrodes 106, 108 corresponding to the mating electrodes 80, 82 of the fixture 70 shown in FIG. 3. With this arrangement, achieving both electrical connection and mechanical mounting of the OLED device 100 onto or into the overhead fixture 102 is accomplished by raising or lifting the OLED device 100 up with the device roughly aligned with the overhead fixture 102 until the magnetic mating electrodes 106, 108 are close enough to the electrodes containing magnetic material of the OLED device 100. At that point, magnetic attraction will automatically complete the lifting of the OLED device 100 up onto or into the overhead fixture 102 and will advantageously simultaneously align and electrically conductively connect its electrodes with the magnetic mating electrodes 106, 108 of the overhead fixture 102.

Figure 6:
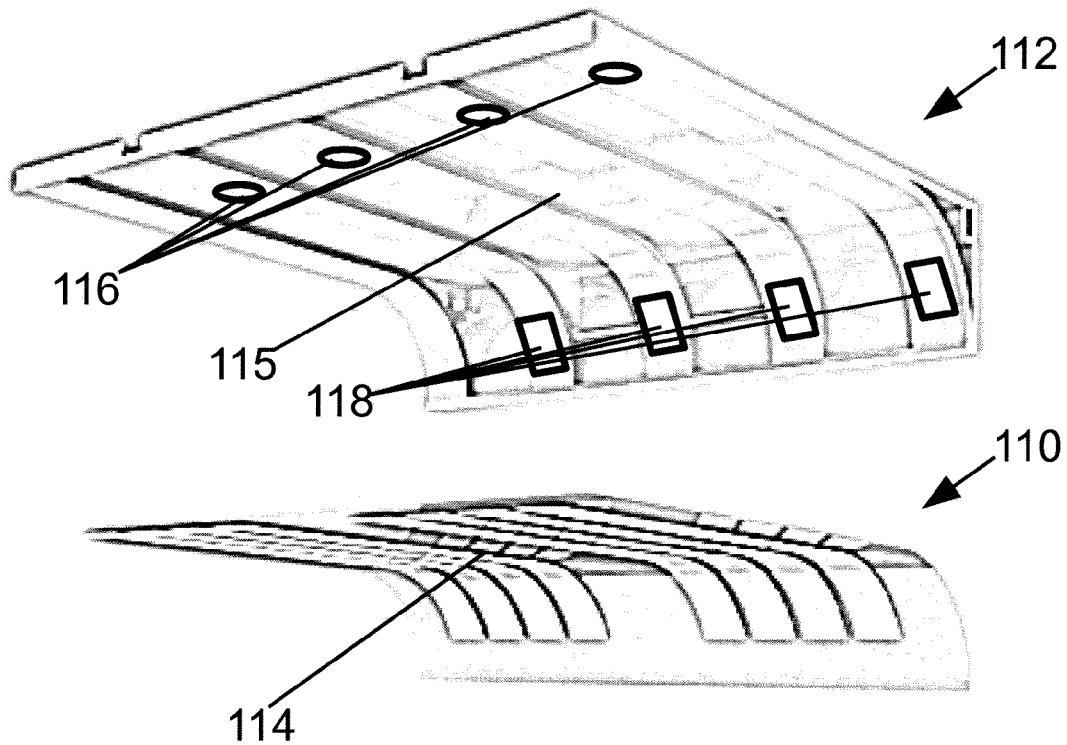
Figure 7:
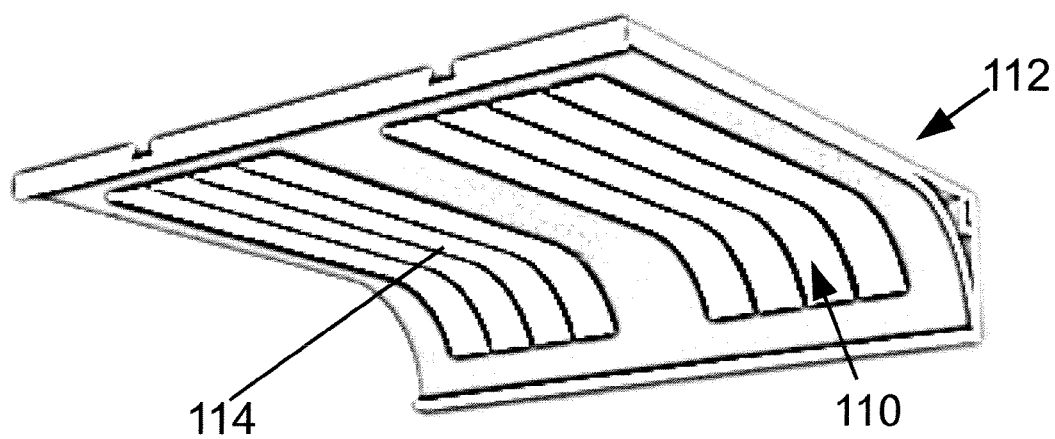
Figure 8:
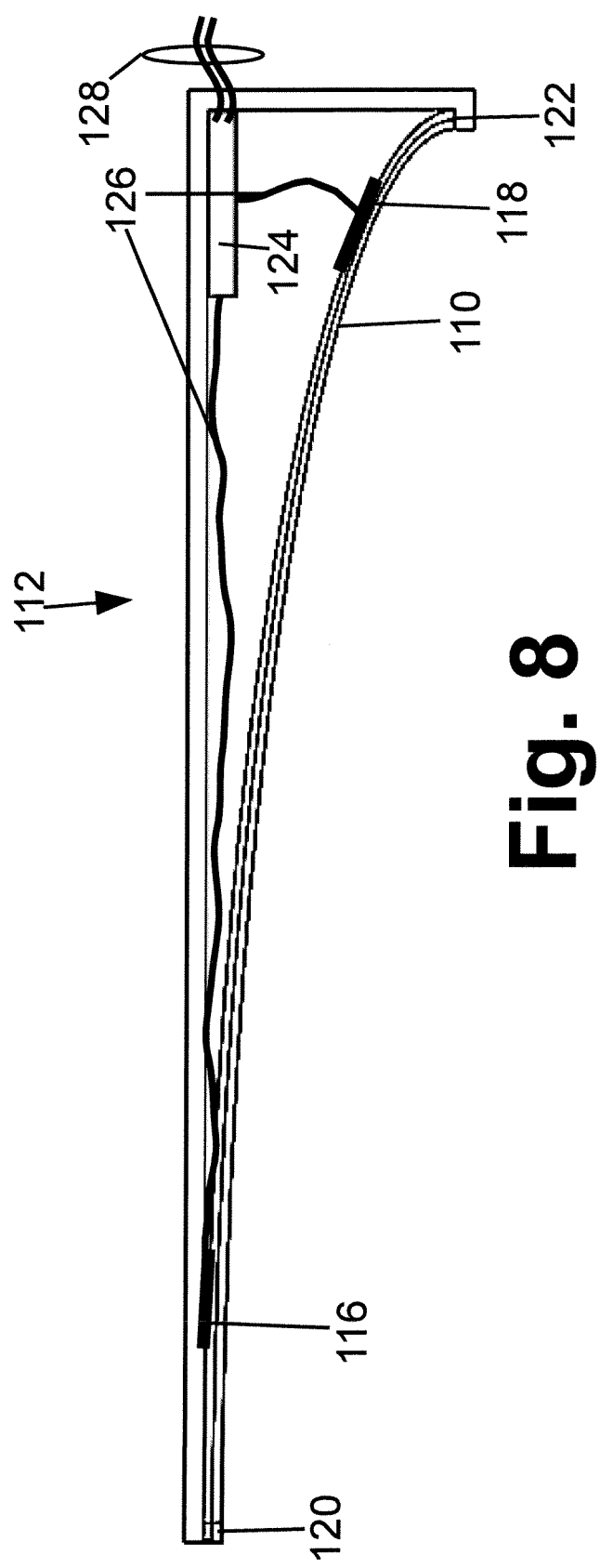

With reference to FIGS. 6-8, the approach is readily employed with flexible or curved thin film solid state lighting devices. FIGS. 6-8 illustrate a flexible OLED device 110 connecting with a curved lighting fixture 112. The flexible planar OLED device 110 includes a light emissive lower surface 114 facing generally downward, and an upper surface (not visible in FIGS. 6-8) which includes electrodes containing magnetic material corresponding to the electrodes 40, 42 (FIGS. 1 and 3) or to the electrodes 60, 62 (FIG. 2). The lighting fixture 112 corresponds to the fixture 70 shown in FIG. 3, but has a curved mounting surface 115 that includes a set of magnetic mating electrodes 116 (either anode electrodes or cathode electrodes) and a set of magnetic mating electrodes 118 (either cathode electrodes or anode electrodes, being opposite of the type of the electrodes 116). The magnetic mating electrodes 116, 118 correspond to the mating electrodes 80, 82 of the fixture 70 shown in FIG. 3. With this arrangement, achieving both electrical connection and mechanical mounting of the OLED device 110 onto or into the lighting fixture 112 is accomplished by raising or lifting the flexible OLED device 110 up with the device roughly flexed and aligned with the mounting surface 115 of the lighting fixture 102 until the magnetic mating electrodes 116, 118 are close enough to the electrodes containing magnetic material of the OLED device 110. At that point, magnetic attraction will automatically complete the lifting of the OLED device 110 up onto or into the lighting fixture 112 and will advantageously simultaneously align and electrically conductively connect its electrodes with the magnetic mating electrodes 116, 118 of the lighting fixture 112.

With particular reference to FIG. 8, depending upon the weight of the flexible OLED device 110, the total area and locations of the magnetic mating electrodes 116, 118, the magnetic strength of the magnetic mating electrodes 116, 118, and other factors, the magnetic coupling may be insufficient by itself to ensure mechanical retention of the flexible OLED device 110 on the mounting surface 115 of the lighting fixture 112. In such cases, additional mechanical support may be provided. In FIG. 8, cornered tabs 120, 122 formed in the edges of the mounting surface 115 of the lighting fixture 112 provide such additional support. Although the OLED device 110 is flexible, it has substantial resistance to in-plane shear stress (in other words, it resists "crumpling" due to in-plane compressive stress). Accordingly, the flexible OLED device 110 can be compressed against the tabs 120, 122 with the shear stress pressing the central region of the OLED device 110 against the central area of the mounting surface 115, so as to impart additional mechanical retentive force. Advantageously, the tabs 120, 122 also assist in aligning the flexible OLED device 110 in the lighting fixture 112. By way of example, in a suitable approach the installer may press the edge of the flexible OLED device 110 against the mating tab 122, then push the central area of the OLED device 110 up flush against the mounting surface 115 until the opposite edge of the flexible OLED device 110 matches up and presses against the distal tab 120.

FIG. 8 also diagrammatically shows internal electrical components of the lighting fixture 112. An electrical power supply component 124 corresponding to the electrical power supply component 72 shown in phantom in FIG. 3 is mounted at a convenient internal location in the lighting fixture 112, and connects with the magnetic mating electrodes 116, 118 via wiring 126. A wire pigtail 128 or other electrical coupler provides for delivery of electrical power to the lighting fixture 112.

Figure 9:
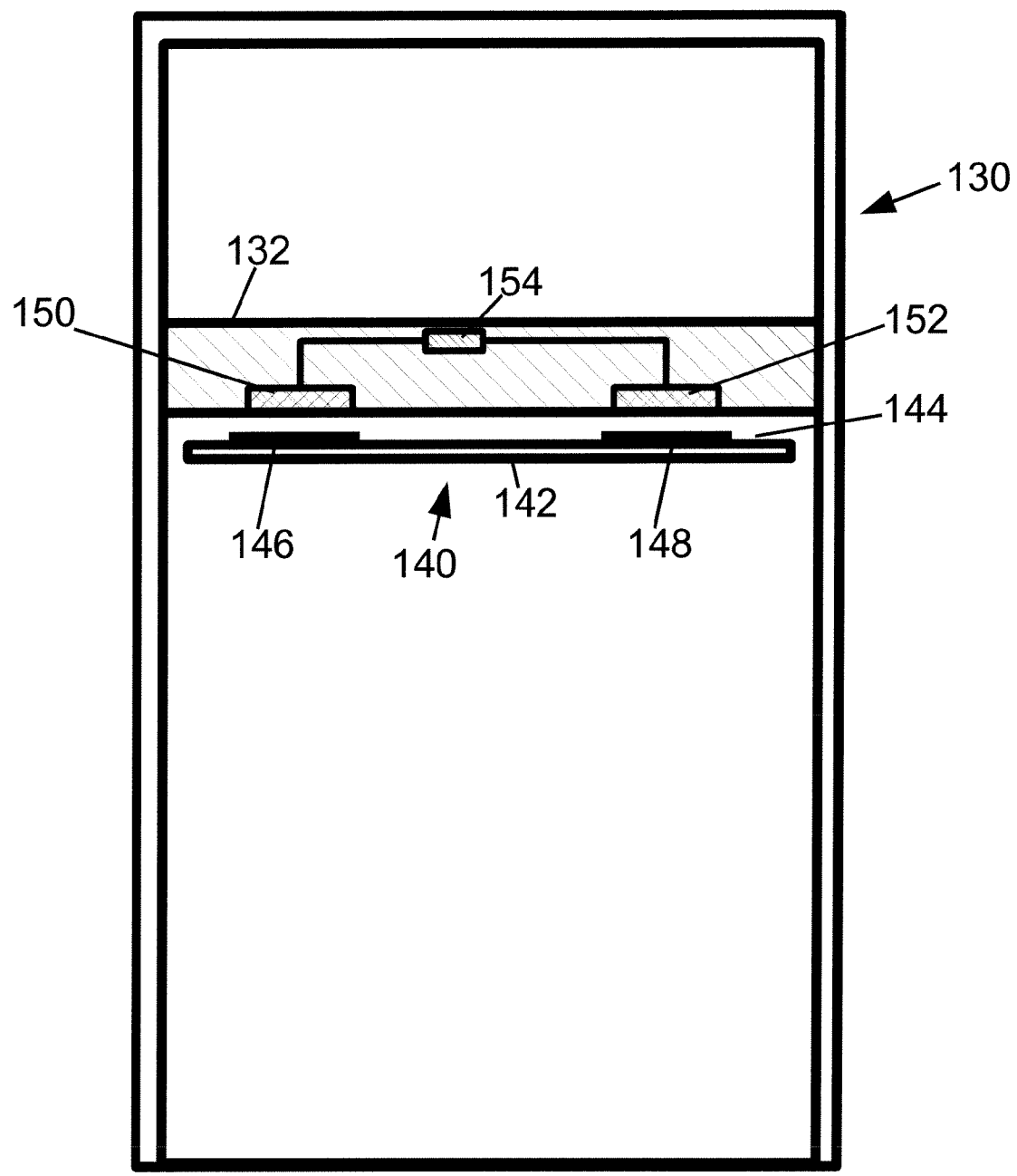

With reference to FIG. 9, it is to be understood that the connecting element or fixture can be integrated with another structure, that is, the lighting fixture can be integrated with another structure. By way of example, FIG. 9 illustrates a cabinet 130 having a horizontal shelf 132. The fixture is integrated with the horizontal shelf 132, or in other words the horizontal shelf 132 also serves as a lighting fixture for mounting a planar OLED device 140 having a lower (downward facing) light emission surface 142 and an opposite (upward facing) surface 144 including electrodes 146, 148 containing magnetic material. Toward this end, the horizontal shelf 132 has on its lower surface magnetic mating electrodes 150, 152 corresponding to the mating electrodes 80, 82 of the fixture 70 shown in FIG. 3, which are electrically connected with an electrical power supply component 154 also mounted in the shelf 132. The electrical power supply component 154 corresponds to the electrical power supply component 72 shown in phantom in FIG. 3. The operation is analogous to that described for the embodiment of FIGS. 4 and 5, namely that the planar OLED device 140 is lifted up with its face 142 facing the bottom (mounting surface) of the horizontal shelf 132 until its electrodes 146, 148 containing magnetic material are drawn by magnetic attraction to the magnetic mating electrodes 150, 152 so as to effectuate both conductive electrical connection and mechanical mounting.

Figure 10:
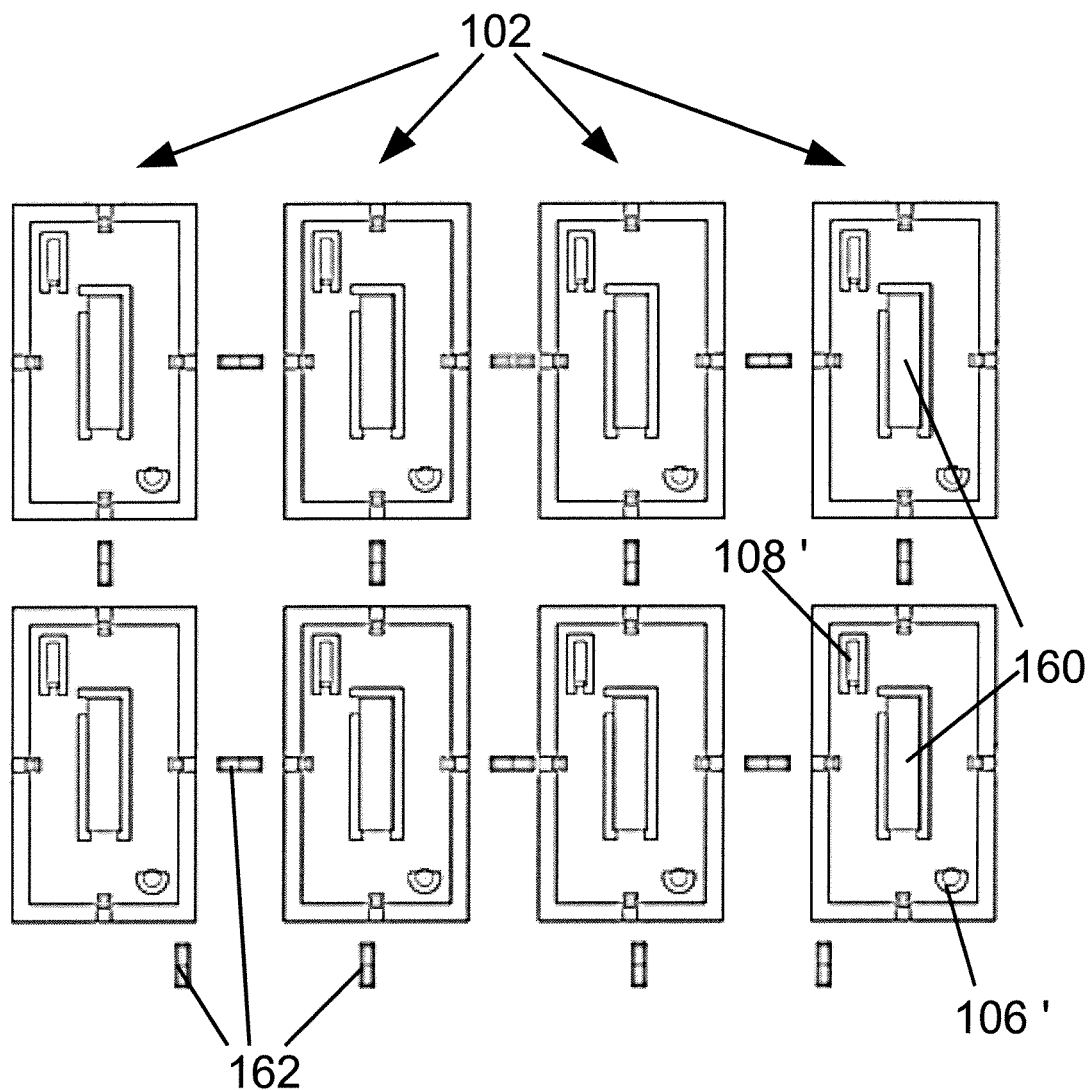
FIG. 10 illustrates a tiled arrangement of the fixtures of FIG. 4.

With reference to FIG. 10, fixtures 102 corresponding to the fixture 102 shown in FIG. 4 are shown in a tiled arrangement. FIG. 10 shows the fixtures 102 in a laterally exploded view, with each fixture 102 viewed from the opposite side from the mounting side seen in FIG. 4. In the view of FIG. 10, the magnetic mating electrodes 106, 108 are not directly visible, but corresponding magnet mounting recesses 106', 108' are visible, along with recesses 160 for mounting an electrical power supply component in each fixture 102. Electrical jumpers 162 electrically interconnect the fixtures 102 at edges of the fixtures 102. The electrical interconnection of the fixtures 102 is controlled by the configuration of the electrical jumpers 102 and circuitry of the electrical power supply components, and in general the tiled fixtures 102 can be electrically interconnected in parallel, series, or another electrical layout.

With reference back to FIGS. 1 and 2, the disclosed lighting devices, lighting fixtures, lamp mounting techniques, and the like can be used or performed in conjunction with various types of thin film solid state lighting devices that have a planar light emitting side and an opposite planar mounting side and that include electrodes disposed on the planar mounting side of the thin film solid state lighting device. One class of such devices is the class of organic light emitting diode (OLED) devices. These devices can include electrodes 40, 42 contacting the thin film light emitting structure 12 through backside vias (FIG. 1) or can have electrical connection passing out sides of the device with electrodes 50, 52 wrapped around to the planar mounting side 22 by respective conductive trace portions 54, 56 to electrically contact electrode portions 60, 62 (FIG. 2). The former arrangement is particularly convenient insofar as it reduces device complexity and potential points of moisture ingress, which is advantageous since some OLED active materials degrade rapidly upon exposure to moisture or some other environmental contaminants.

With reference to FIGS. 11-14 some additional illustrative embodiments of OLED devices having electrodes contacting the thin film light emitting structure 12 through backside vias are described.

In general, OLED devices can be produced using various fabrication processes. The OLED active light-emitting material or materials can be formed by vacuum deposition, using solution processed materials, or so forth, using various substrates such as glass or plastic film. OLED devices produced in a flat thin format find use in applications such as display or general illumination applications. The use of a plastic substrate facilitates low cost roll to roll production. Various barrier films are suitably used, such as barrier layers comprising a thin transparent oxide layer on a transparent plastic film. Various "layers" comprising the illustrative devices may be variously embodied as coatings, films, discrete sheets, or so forth, a given layer may comprise a composite of two or more constituent layers.

Figure 11:
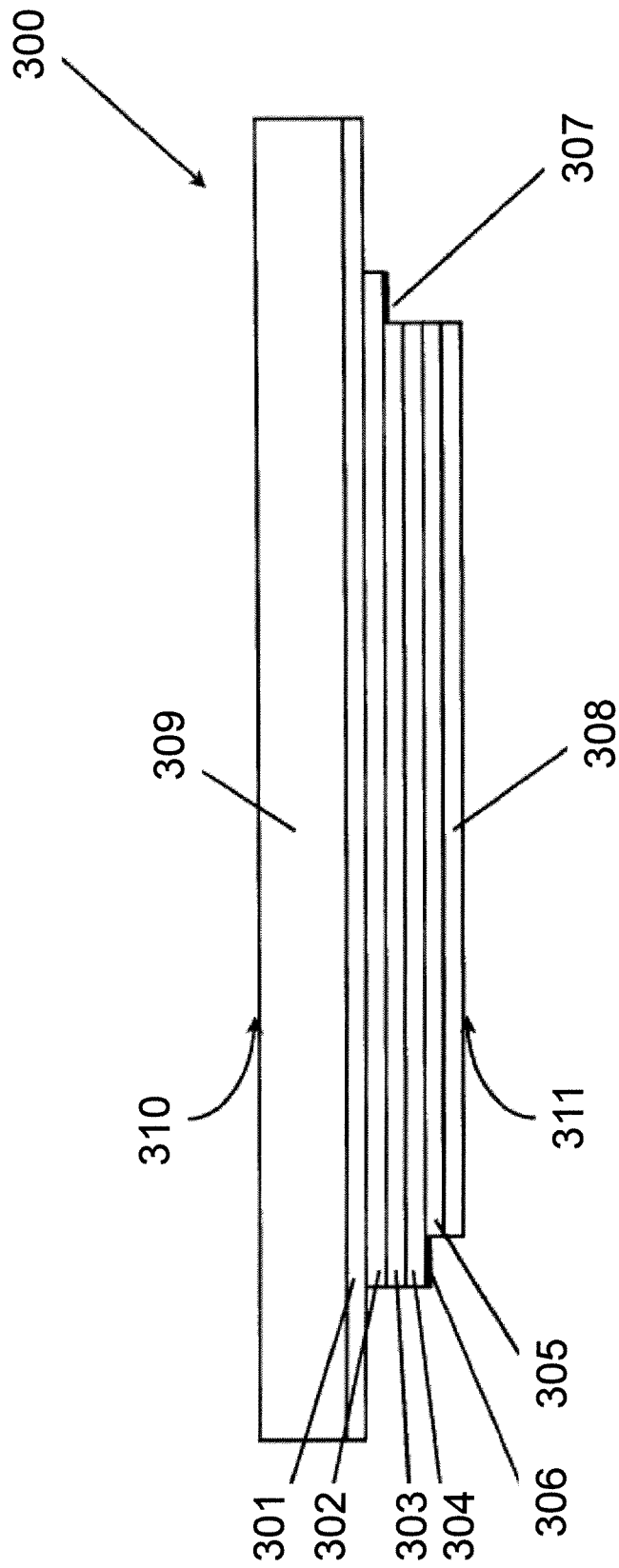
FIGS. 11-14 show side-sectional views of some illustrative hermetically sealed OLED devices suitably used as the thin film solid state lighting device of FIG. 1.

With reference to FIG. 11, an illustrative OLED device 300 includes a glass or plastic substrate 309, a barrier layer 301, a transparent conductive layer 302 that forms a first electrode layer (referred to as an anode layer herein by way of example, although an opposite polarity device is also contemplated), one or more light emitting layers 303, and second electrode layer 304 (referred to herein as a cathode layer, although again a reversed polarity device is also contemplated). Other layers (not illustrated) may also optionally be included, such as one or more of the following optional layers: hole injecting, hole transporting, electron injection and electron transporting layers, or so forth. Illustrated layer 305 is an optional insulating layer that may be used to provide mechanical protection to the cathode layer 304 during fabrication and, to prevent electrical shunting or shorting to other package elements during processing, or for other purposes.

The cathode layer 304 has an exposed region 306 and the anode layer 302 has an exposed region 307. These exposed regions 306, 307 are used to form an electrical connection to electrically energize the device 300. It will be appreciated that there may be multiple exposed regions of the contact layers 302, 304 for making electrical contact. For example, electrically isolated segments or portions of the light emitting layer or layers 303 may optionally be formed by patterning of the layers 302, 303, 304 to form electrically isolated segments or portions with exposed regions of the electrical contact layers 302, 304 that are electrically interconnected in series, parallel, or another electrical configuration using electrically conductive interconnect traces (features not shown). Barrier layer 308 is another optional layer that may be included to provide additional protection to the cathode layer 304. In the OLED device 300, a surface 310 is the light emitting side, and a surface 311 is the non-emitting back side.

The OLED device 300 of FIG. 11 is an illustrative example, and other OLED device configurations can be used in the hermetically sealed packages described herein. Some other suitable OLED devices are described, for example, in U.S. Pat. No. 6,661,029, U.S. Pat. No. 6,700,322, U.S. Pat. No. 6,800,999 and U.S. Pat. No. 6,777,871, each of which is incorporated herein by reference in its entirety.

Figure 12:
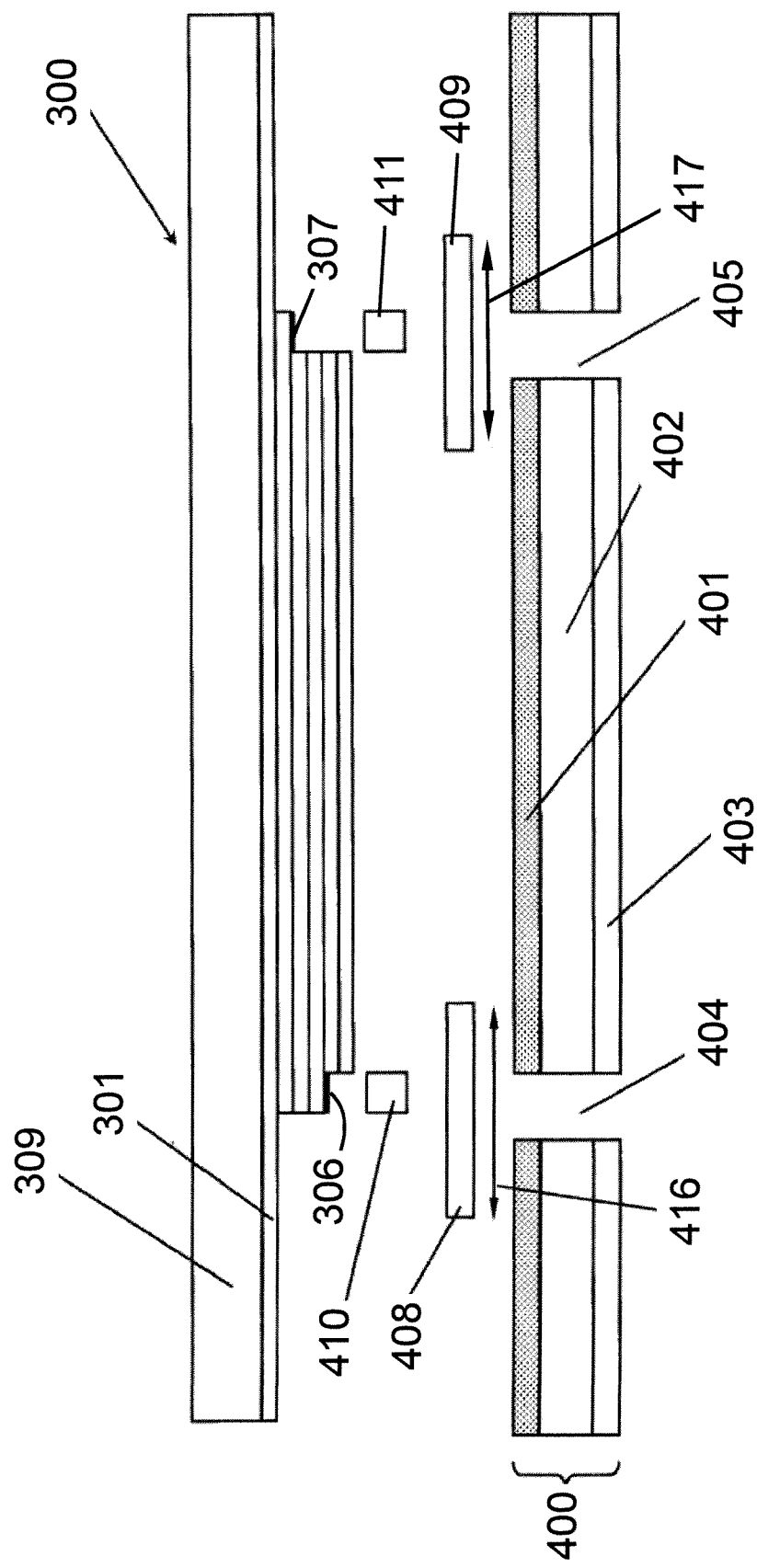

With reference to FIG. 12, an exploded view of a hermetically sealed electrical package is shown, which includes the OLED device 300 along with a backsheet 400 and electrically conducting elements 410, 411 that electrically contact the exposed areas 306, 307 of the contact layers 302, 304. In the hermetically sealed package, the backsheet 400 and the glass or plastic substrate 309 on which the OLED device 300 is formed cooperatively define a sandwiching confinement structure for the hermetically sealed package. Some suitable materials for the substrate 309 in this sealed package include transparent flexible plastics, such as polyesters and polycarbonates, particularly optical grades of such plastics. Suitable materials for barrier layer 301 include materials having a low moisture permeability rate, for example a moisture permeability rate of preferably less than about $10^{-4}$ cc/m²/day, and more preferably less than $10^{-5}$ cc/m²/day, and still more preferably less than about 10-6 cc/m²/day, these values being specified for a temperature of about 23° C. Some suitable materials for the barrier layer 301 include UHB materials, such as described for example in U.S. Pat. No. 7,015,640, U.S. Pat. No. 6,413,645, U.S. Pat. No. 6,492,026, U.S. Pat. No. 6,537,688, and U.S. Pat. No. 6,624,568, each of which is incorporated herein by reference in its entirety, or flexible or rigid glass, transparent metals and oxides having sufficient moisture and/or oxygen barrier properties, such as indium tin oxide (ITO), and combinations of these.

In the illustrated embodiment, the backsheet 400 is a multilayer foil which is made up of a thin interface layer 401, a barrier layer 402, and an optional insulating layer 403. Some suitable materials for use as the backsheet 400 include commercially available multilayer packaging or lidding materials having moisture- and optionally oxygen-barrier properties in the form of films or sheets, such as heat-sealable materials. Lidding materials are typically composed of multiple thin polymer layers; lidding foils may also include a metal foil, such as aluminum, sandwiched between polymer layers. One example of a suitable material is Tolas TPC-0814B lidding foil, produced by Tolas Healthcare Packaging, Feasterville, Pa., USA, a division of Oliver-Tolas, Grand Rapids, Mich., USA. Holes or vias 404, 405 are formed in the backsheet 400 using any suitable method, such as punching, die cutting, laser machining, lithographic etching, or so forth. The holes 404, 405 can be round or of another lateral geometry or shape, can be of varied diameter or size, or of other shapes and aspect ratios depending on the layout of the OLED device and other design factors.

Patches 408, 409 corresponding to holes or vias 404, 405, respectively, suitably comprise conductive foil elements such as aluminum of sufficient thickness and homogeneity to be impermeable to moisture or other detrimental environmental contaminants. As used herein, the term "patch" refers to a piece or sheet of electrically conductive material used to cover the holes or vias 404, 405. The patches 408, 409 provide hermetic sealing for respective holes or vias 404, 405, and are of sufficient thickness to be impermeable to moisture, oxygen, and/or other contaminants that may have a deleterious effect on the OLED device 300. The patches 408, 409 may, for example, comprise metal foils of sufficient thickness. To further facilitate sealing, the patches 408, 409 are sized to be substantially larger than respective holes or vias 404, 405. In the illustrated embodiment, the patches 408, 409 are sealed to the barrier layer 402 by the interface layer 401 to form respective seal zones 416, 417. The holes or vias 404, 405 may be round, square, or otherwise shaped, and the corresponding patches 408, 409 may be round, square, or otherwise shaped. The patch does not have to have the same shape as the corresponding hole, although this may be the case. The illustrated patches 408, 409 cover holes 404, 405 for the anode and cathode, respectively; however, in general the patches can be configured to cover multiple holes so as to provide lateral busing of electrical current or to facilitate other electrical interconnection configurations (such as is the case in the embodiment of FIGS. 6-8, by way of example). In one example, the patches 408, 409 are fabricated from 0.001 inch thick aluminum foil. The patches 408, 409 are suitably die cut from a foil sheet or otherwise fabricated, and should be sufficiently planar to facilitate hermetic sealing of the respective holes or vias 404, 405.

Some suitable materials for the patches 408, 409 include aluminum, stainless steel, nickel, and brass. In one example, patches are fabricated from 0.001 inch thick aluminum foil. In another example, the patches are fabricated from 0.001 stainless steel. The patches may be die cut from a foil sheet, or may be otherwise formed. The patches should be sufficiently free of burrs at the cut edges of the patches to avoid compromising the package sealing. In some embodiments, the patches 408, 409 are made of a magnetic material such as nickel, a nickel alloy, stainless steel, or another suitable magnetic material that provides the magnetic material for the magnetic mounting described generally with reference to FIGS. 3-10. In these embodiments, the patches 408, 409 may be magnetized or unmagnetized.

The patch 408 is electrically coupled to the exposed area 306 of the cathode layer 304 through electrically conductive element 410. Similarly, the patch 409 is electrically coupled to the exposed area 307 of the anode layer 302 through the electrically conductive element 411. The conductive elements 410, 411 can comprise an electrically conductive adhesive, such as Staystik 571 (available from Cookson Electronics, Alpharetta, Ga., USA), that is placed between electrical contact areas 306, 307 and the corresponding patches 408, 409. The adhesive 410, 411 can be formed or disposed by various fabrication approaches, such as manual dispensation or an automated adhesive dispenser. The vias 404, 405 of the backsheet 400, the corresponding patches 408, 409, the corresponding conductive elements 410, 411, and the corresponding electrode contacts 306, 307 of the OLED device 300 are aligned and laid up in preparation for a lamination process. In some embodiments, the lamination process is performed at a temperature preferably between 90° C. and 130° C., and more preferably at about 120° C., and at a pressure of preferably 1 psi to 30 psi, and more preferably about 15 psi, for a time preferably between 1 second and 10 minutes, and more preferably about 30 seconds. These lamination process parameters are merely illustrative examples, and other lamination processes may be used. The lamination produces the hermetically sealed electrical package in which the patches 404, 405 make electrical connections with respective anode and cathode layer contact areas 306, 307 through respective conductive elements 410, 411. To avoid shunting or shorting of the device, it will be appreciated that the patches 404, 405 should be electrically isolated from each other, and similarly the conductive elements 410, 411 should be electrically isolated from each other. However, as already noted, if a plurality of vias of the same conductivity type are included (for example, multiple vias accessing exposed areas of the anode layer 302) it is contemplated to employ a single patch extending across and sealing these multiple vias of the same conductivity type, thus providing convenient internal electrical interconnection of the vias of the same conductivity type.

In illustrative FIG. 12, the anode layer contact 306 and corresponding patch 408 and via 404 are all generally centrally aligned; and similarly, the cathode layer contact 307 and corresponding patch 409 and via 405 are all generally centrally aligned. However, this is not required, so long as the patches 408, 409 completely cover and seal respective openings 404, 405. Indeed, it is contemplated that some offset orientation between these components may prove advantageous in optimizing the OLED device layout and the package design.

The disclosed illustrative combination of materials can be laminated using a single lamination process for bonding both the conductive elements 410, 411 and the interface layer 401 under the same lamination conditions. However, it is also contemplated to use two or more lamination processes to form these bondings. Moreover, it may be desirable to create a subassembly of selected elements prior to final lamination. For example, the patches 404, 405 are optionally attached to the backsheet 400 in a first operation, followed by lamination of the OLED device 300 to the backsheet 400 in a second operation.

Various lamination processes can be used, such as pouch lamination, roll lamination, hot press lamination, or so forth, using various process-dependent lamination parameters. The lamination process or processes may optionally employ release films, press pads, tooling plates, or so forth as appropriate or beneficial for the lamination process or processes. Other process operations are also contemplated to enhance the OLED device fabrication process. For example, operations to clean and remove moisture from package materials may be advantageous, such as baking the backsheet 400 at 80° C. for 12 hours under vacuum to eliminate moisture. Various process operations may also optionally be performed in an inert atmosphere or other steps may be taken to prevent contamination by moisture, oxygen, or other potentially detrimental contaminants.

The patches 408, 409 and backsheet 400 are sealed in such a way that the aforementioned seal zones 416, 417 are created in a way that presents a geometrically unfavorable ingress path for moisture and oxygen. The geometry of the seal zones 416, 417 can be described as a ratio $R_1$ of seal zone path length to the thickness of interface layer 401. A large ratio $R_1$ provides a more difficult ingress path for a given material set. Depending on the shape, size and alignment of respective holes 404, 405 and patches 408, 409 the ratio $R_1$ could vary depending on the particular path chosen for analysis. In one illustrative embodiment, the vias 404, 405 have a diameter of 0.25 inch (0.635 cm) and the patches 408, 409 have a diameter of 1.25 inches (3.175 cm), so that seal zone path length is 0.5 inches (1.27 cm), and ratio $R_1$ is approximately 500:1. (It is to be understood that the dimensions are not depicted to scale in the drawings). In general, reduction in the thickness of interface layer 401 (that is, the permeation path between barrier 402 and the patch 408, 409) is expected to increase the ratio $R_1$ and improve the hermetic sealing of the via 404, 405. In addition, it may be desirable to minimize the diameters of vias 404, 405. For example, reduction to a diameter of approximately 0.025 inch (0.064 cm) using suitable fabrication and alignment procedures is expected to enhance sealing. Depending on the layout of device OLED device 300, smaller vias 404, 405 may be desirable to achieve other design objectives such as maximizing the light-emitting area of the device.

It is also contemplated for the backsheet to include an electrically conductive layer, in which case the via or vias of one conductivity type can be omitted, as the electrically conductive layer of the backsheet can replace one of the patches (embodiment not illustrated). In such an embodiment the via or vias for accessing the electrical contact layer of the other conductivity type must be electrically insulated using a suitable annular insulating insert, insulating coating, or so forth, to avoid shorting or shunting to the electrically conductive layer of the backsheet.

Figure 13:
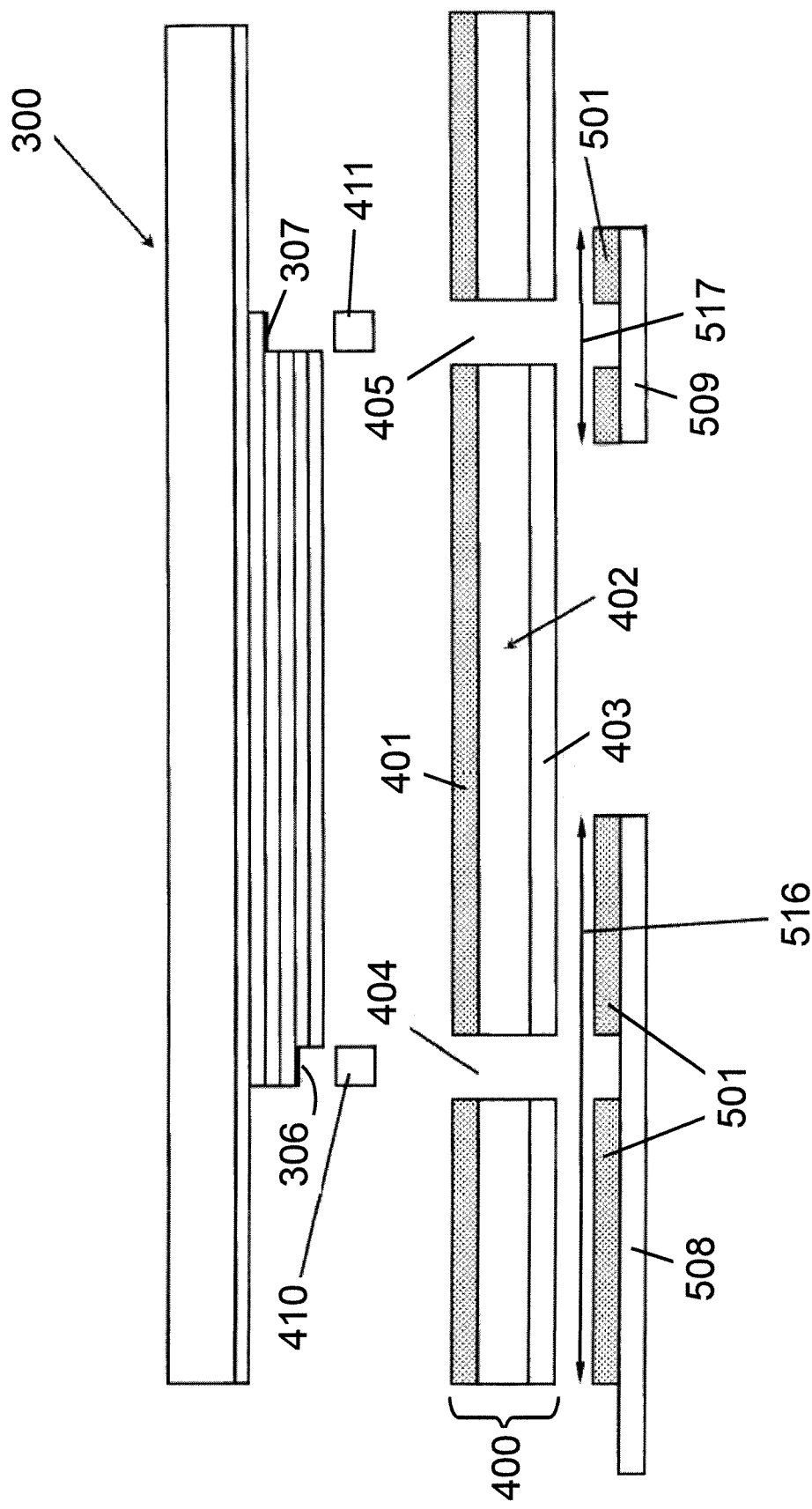

With reference to FIG. 13, an exploded view of an alternative embodiment is shown, in which the internally located patches 408, 409 are replaced by externally located patches 508, 509 that are located on the opposing face of backsheet 400 with respect to the device 300. To facilitate hermetic sealing, the patches 508, 509 optionally include an interface layer 501, such as an adhesive. Materials suitable for use in interface layer 501 have low permeability to at least moisture and oxygen. In addition, the materials preferably can be processed at relatively low temperatures, for example preferably less than 150° C., and more preferably less than 120° C. In one example, PRIMACOR 3460 thermoplastic adhesive (available from Dow Chemical, Midland, Mich., USA) is used to prepare a 0.001 inch thick layer. The patches 508, 509 (with optional interface layer 501) are aligned to the openings 404, 405 of the backsheet 400 and are laminated therewith. In some embodiments, the lamination process parameters include a temperature of preferably between 95° C. and 125° C., and more preferably about 115° C., and a pressure of preferably between 5 psi to 20 psi, and more preferably about 10 psi, for a time preferably between 1 minute and 10 minutes, and more preferably about 2 minutes. Various lamination processes are suitable, such as pouch lamination, roll lamination hot press lamination, or so forth, and optionally may employ release films, press pads, tooling plates, or so forth (not shown). Other materials suitable for use as the optional interface layer 501 include thermosets and thermoplastic adhesives.

The arrangement of FIG. 13 enables the aforementioned ratio $R_1$ to be generally larger as compared with the embodiment of FIG. 12, because the sizes of the patches 508, 509 are not limited by the size and location of the OLED device 300 and its exposed anode and cathode layer areas 306, 307. Indeed, the illustrative patch 508 extends beyond the edge of the package, as illustrated for the patch 508. In one quantitative example, the path length may be 1.0 inches (2.54 cm), and the interface layer 501 may have a thickness of 0.001 inch (0.0025 cm), so as to yield the ratio $R_1$=1000:1.

In the illustrative embodiment of FIG. 13, the OLED device 300 is laminated with the backsheet 400 in a separate lamination process from the lamination process that binds the backsheet 400 and the patches 508, 509. In this lamination process are aligned and laid up the backsheet 400, the OLED device 300, and the conductive elements 410, 411. The patches 508, 509 can be laminated with the backsheet 400 first, followed by lamination of the OLED device 300 with the backsheet 400. Alternatively, the backsheet 400 can be laminated with the OLED device 300 first, followed by lamination of the patches 508, 509. In this second alternative lamination sequence, the first lamination process results in a sealed package in which the OLED device 300 is protected from mechanical damage and moisture ingress, but the seal is less than ideal due to the lack of the patches 508, 509. Nonetheless, due to protection of the OLED device 300 afforded by the first lamination process, it is contemplated to perform the second lamination process which joins the conductive elements 410, 411 and patches 508, 509 after a lapse of time. In yet other contemplated embodiments, the first and second lamination processes are combined as a single lamination process.

Figure 14:
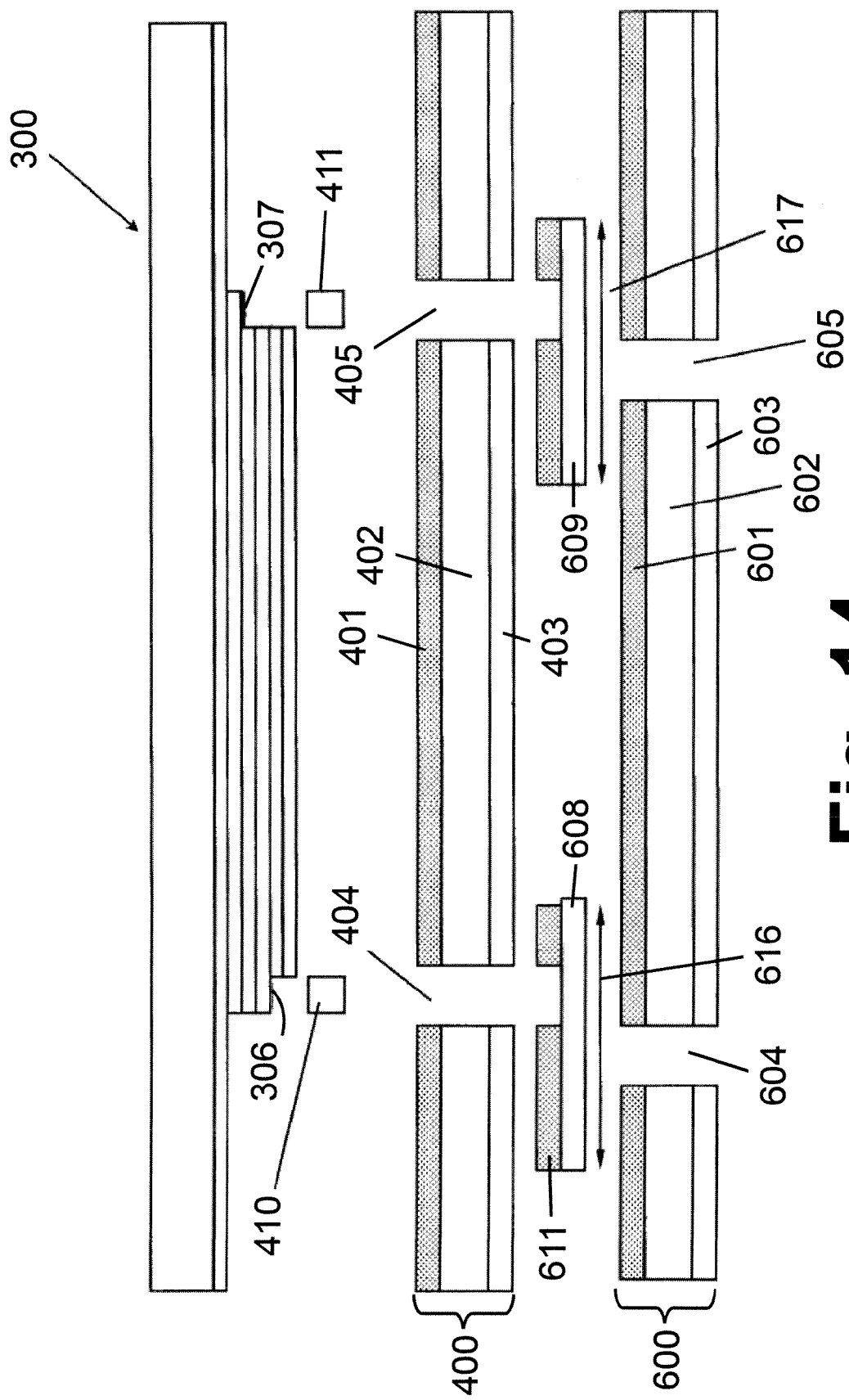

With reference to FIG. 14, an exploded view of yet another embodiment of a hermetically sealed package is illustrated, which again includes the OLED device 300, the backsheet 400 with openings or vias 404, 405, and the electrically conducting elements 410, 411. In this embodiment patches 608, 609 forming respective seal zones 616, 617 are sandwiched between the backsheet 400 and a second backsheet 600 having openings or vias 604, 605 corresponding to the openings or vias 404, 405, and including a thin interface layer 601, a barrier layer 602, and an optional insulating layer 603 similar to the respective layers 401, 402, 403 of the backsheet 400. The patches 608, 609 are optionally provided with adhesive 611. This embodiment allows a large ratio $R_1$ for the reasons analogous to those described for the embodiment of FIG. 13. Various lamination processes and process sequences are contemplated for the embodiment of FIG. 14.

Some illustrative examples of OLED devices comprising a hermetically sealed package having backside contacts passing through vias in a backsheet and including sealing patches have been described. Some additional illustrative examples are set forth in Farquhar et al., "Hermetic Electrical Package", Ser. No. 12/470,033, filed May 21, 2009, which is incorporated herein by reference in its entirety. Additionally, although the devices of FIGS. 11-14 are described herein as OLED devices by way of illustrative example, other thin film solid state lighting devices can be similarly constructed by employing a suitable light emitting material or material structure as the one or more light emitting layers 303.

With continuing reference to FIGS. 11-14, modification of the devices to incorporate a magnet or magnetic material in the electrodes can be done in various ways. In one approach, the patches 408, 409, 508, 509, 608, 609 are suitably made of nickel, a nickel alloy, stainless steel, or another suitable magnetic material. If a permanent magnet is desired, the patches can be magnetized. This approach is advantageous in that the patches 408, 409, 508, 509, 608, 609 are of large area and hence provide a substantial mass of magnetic material to facilitate magnetic mounting and simultaneous magnetic conductive electrical connection with the fixture 70, 102, 112, 132.

In other embodiments, additional external magnetic electrode material may be added to complete the electrode. For example, in the embodiment of FIGS. 11 and 12, the vias 404, 405 are optionally filled with additional electrically conductive material (not shown) to provide electrical contact with the buried patches 408, 409. Similarly, in the embodiment of FIG. 14 the vias 604, 605 of the second backsheet 600 are preferably filled with additional electrically conductive material (not shown) to provide electrical contact with the buried patches 608, 609. (It should be noted that when performing such via filling, if the barrier layer 402 or barrier layer 602 is made of an electrically conductive material then the via walls must be insulated using a deposited insulator, insulating bushing element, or the like).

The embodiment of FIG. 13 is particularly attractive for inclusion of magnetic material-based electrical and mechanical mounting to a lighting fixture because in that embodiment the patches 508, 509 are directly exposed on the surface of the hermetically sealed OLED package, making magnetic coupling therewith by mating magnetic electrodes particularly effective.

The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. An article of manufacture comprising:
   an organic light emitting diode (OLED) device having a planar light emitting side and an opposite planar mounting side, the OLED device including a backsheet sealing the planar mounting side and electrodes providing an electrically conductive pathway for electrically energizing the OLED device to cause the planar light emitting side to emit light, the electrodes passing through holes in the backsheet, the electrodes including patches of electrically conductive magnetic material that are part of the electrically conductive pathway and that seal the holes in the backsheet such that the OLED device, backsheet, and patches of electrically conductive magnetic material together define a sealed planar package, each patch comprising a foil element covering the hole in the backsheet that is sealed by the patch, the foil element being larger in area than the hole in the backsheet that is sealed by the patch; and
   a fixture having mating electrodes arranged to mate with the electrodes of the OLED device, the mating electrodes of the fixture including magnetic material that magnetically attracts the patches of electrically conductive magnetic material to mechanically connect the OLED device with the fixture and simultaneously electrically connect the OLED device with the fixture;
   wherein the OLED device is planar and does not include any power conditioning electronics.

2. The article of manufacture as set forth in claim 1, wherein the magnetic material of the mating electrodes of the fixture are magnetized to define permanent magnets that magnetically attract the patches of electrically conductive magnetic material to mechanically connect the OLED device with the fixture and simultaneously electrically connect the OLED device with the fixture.

3. The article of manufacture as set forth in claim 1, wherein the patches of electrically conductive magnetic material are magnetized to define permanent magnets that magnetically attract the magnetic material of the mating electrodes to mechanically connect the OLED device with the fixture and simultaneously electrically connect the OLED device with the fixture.

4. The article of manufacture as set forth in claim 1, wherein:
   the patches of electrically conductive magnetic material are magnetized to define permanent magnets; and
   the magnetic material of the mating electrodes of the fixture are magnetized to define permanent magnets; and
   the polarities of the defined permanent magnets of the OLED device and the fixture are selected to form a keyed attachment such that the OLED device can only be connected with the fixture with a correct electrical polarity.

5. The article of manufacture as set forth in claim 1, wherein the fixture further comprises:
   an additional mechanical support element providing additional mechanical connection of the OLED device with the fixture.

6. The article of manufacture as set forth in claim 5, wherein the additional mechanical support element of the fixture comprises:
   tabs formed in the fixture that compressively hold the OLED device to impart additional mechanical retentive force.

7. An article of manufacture comprising:
   an organic light emitting diode (OLED) device having planar light emitting side comprising a glass or plastic substrate, an OLED layer, and an opposite planar mounting side comprising a backsheet sealing with the planar light emitting side at the periphery of the OLED layer to hermetically seal the OLED layer, and including electrodes passing through openings in the backsheet and not passing through the peripheral seal of the backsheet with the planar light emitting side, the electrodes including patches of magnetic material configured to conductively convey electrical drive current to drive the OLED layer to emit light at the planar light emitting principal side, wherein the patches are larger in area than the openings in the backsheet through which the electrodes pass;
   wherein the OLED device including the electrodes define a hermetically sealed planar unit with the electrodes exposed at the planar mounting side, the patches also hermetically sealing the openings in the backsheet through which the electrodes pass.

8. The article of manufacture as set forth in claim 7, wherein the magnetic material of the electrodes comprises a ferromagnetic material.

9. The article of manufacture as set forth in claim 7, further comprising:
a fixture having magnets arranged to mate with the electrodes exposed at the planar mounting side of the OLED device to magnetically secure the OLED device with the fixture and to concurrently form electrically conductive paths including the magnetic material of the electrodes configured to conductively convey electrical drive current from the fixture to the OLED device.

10. The article of manufacture as set forth in claim 7, wherein the electrodes exposed at the planar mounting side are not permanent magnets.

11. The article of manufacture as set forth in claim 7, wherein the magnetic material is magnetized to define magnetized electrodes including permanent magnets.

12. The article of manufacture as set forth in claim 11, wherein the magnetized electrodes have magnetization polarities configured to define magnetically keyed magnetized electrodes.

13. The article of manufacture as set forth in claim 7, further comprising:
a fixture having mating electrodes including magnetic material arranged to mate with the electrodes disposed on the planar mounting side of the OLED device;
wherein at least one of (i) the electrodes passing through the openings in the backsheet of the OLED device and (ii) the mating electrodes of the fixture are permanent magnets such that mating the electrodes passing through the openings in the backsheet of the OLED device with the mating electrodes magnetically secures the OLED device with the fixture and concurrently forms an electrically conductive drive current path from the fixture to the OLED device that includes the electrodes passing through the openings in the backsheet of the OLED device.

14. The article of manufacture as set forth in claim 13, wherein:
the mating electrodes are permanent magnets; and the electrodes passing through the openings in the backsheet of the OLED device and including the magnetic material are not permanent magnets.

15. The article of manufacture as set forth in claim 13, wherein the fixture includes jumpers electrically interconnecting a plurality of said OLED devices.

16. The article of manufacture as set forth in claim 7, wherein the OLED device is planar and does not include any power conditioning electronics.

17. An article of manufacture comprising:
a unitary hermetically sealed organic light emitting diode (OLED) device having a planar light emitting side including a glass or plastic substrate with a barrier layer and an opposite planar mounting side including a backsheet with a barrier layer, the OLED device further including an OLED layer sandwiched between and hermetically sealed by the glass or plastic substrate and the backsheet, the planar mounting side including electrodes passing through openings in the backsheet, the electrodes including patches comprising magnetic metal foil elements covering and hermetically sealing said openings in the backsheet, the electrodes providing electrically conductive pathways through the backsheet for electrically energizing the unitary hermetically sealed OLED device to cause the planar light emitting side to emit light; and
a fixture having mating electrodes magnetically mating with the electrodes of the unitary hermetically sealed OLED device to mechanically connect the unitary hermetically sealed OLED device with the fixture and simultaneously electrically connect the unitary hermetically sealed OLED device with the fixture.

18. The article of manufacture as set forth in claim 17, wherein the electrodes of the unitary hermetically sealed OLED device are magnetized to define permanent magnets magnetically mating with the mating electrodes of the fixture.

19. The article of manufacture as set forth in claim 17, wherein the mating electrodes of the fixture are magnetized to define permanent magnets magnetically mating with the electrodes of the unitary hermetically sealed OLED device.

20. The article of manufacture as set forth in claim 17, wherein the unitary hermetically sealed OLED device does not include any power conditioning electronics.

* * * * *